(12) United States Patent
Krishnan et al.

(10) Patent No.: US 8,552,787 B2
(45) Date of Patent: Oct. 8, 2013

(54) METHODS AND APPARATUS FOR A GRAY-CODED PHASE ROTATING FREQUENCY DIVIDER

(75) Inventors: Koushik Krishnan, San Jose, CA (US); Jafar Savoj, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 589 days.

(21) Appl. No.: 12/813,386

(22) Filed: Jun. 10, 2010

(65) Prior Publication Data

US 2011/0304374 A1 Dec. 15, 2011

(51) Int. Cl.
*H03K 3/00* (2006.01)
(52) U.S. Cl.
USPC .......................................................... 327/298
(58) Field of Classification Search
USPC ........................................................... 327/99
See application file for complete search history.

(56) References Cited

U.S. PATENT DOCUMENTS

| 6,400,735 | B1 * | 6/2002 | Percey | 370/518 |
| 6,901,126 | B1 | 5/2005 | Gu | |
| 2005/0285636 | A1 * | 12/2005 | Ikeda | 327/99 |

FOREIGN PATENT DOCUMENTS

WO 2004084412 A1 9/2004

OTHER PUBLICATIONS

Miletic, I. et al; "Quantization noise reduction using multiphase PLLs", Circuits and Systems, 2006. ISCAS 2006. Proceedings. 2006 IEEE International Symposium on; Digital Object Identifier: 10.1109/ISCAS.2006.1693525 Publication Year: 2006; p. 4078-4081.
Yu, X et al; "A ΔΣ Fractional-N Synthesizer with Customized Noise Shaping for WCDMA/HSDPA Applications", Solid-State Circuits, IEEE Journal of ; vol. 44 , Issue: 8; Publication Year: 2009 , pp. 2193-2201.
Craninckx, J. et al; "A 1.75-GHz/3-V dual-modulus divide-by-128/129 prescaler in 0.7-μm CMOS"; Solid-State Circuits, IEEE Journal of; vol. 31 , Issue: 7, Publication Year: 1996 , pp. 890-897.
International Search Report and Written Opinion—PCT/US2011/039835, International Search Authority—European Patent Office—Aug. 22, 2011.

\* cited by examiner

*Primary Examiner* — Daniel Rojas
(74) *Attorney, Agent, or Firm* — Ramin Mobarhan

(57) ABSTRACT

Methods and apparatus for a gray-coded phase rotating frequency divider. A phase selector is provided that includes two or more selectors, each selector configured to receive multiple clock phases and output a respective clock phase based on one or more selection bits that are part of a selection input, and a gray code generator configured to generate a gray coded output that forms the selection input so that when the gray coded output changes state only selection bits associated with a single selector change. A method includes grouping a plurality of clock phases into two or more groups, for each group, selecting a respective clock phase based on one or more selection bits that are part of a selection input, and generating a gray coded output that forms the selection input so that when the gray coded output changes state only selection bits associated with a single group change.

20 Claims, 9 Drawing Sheets

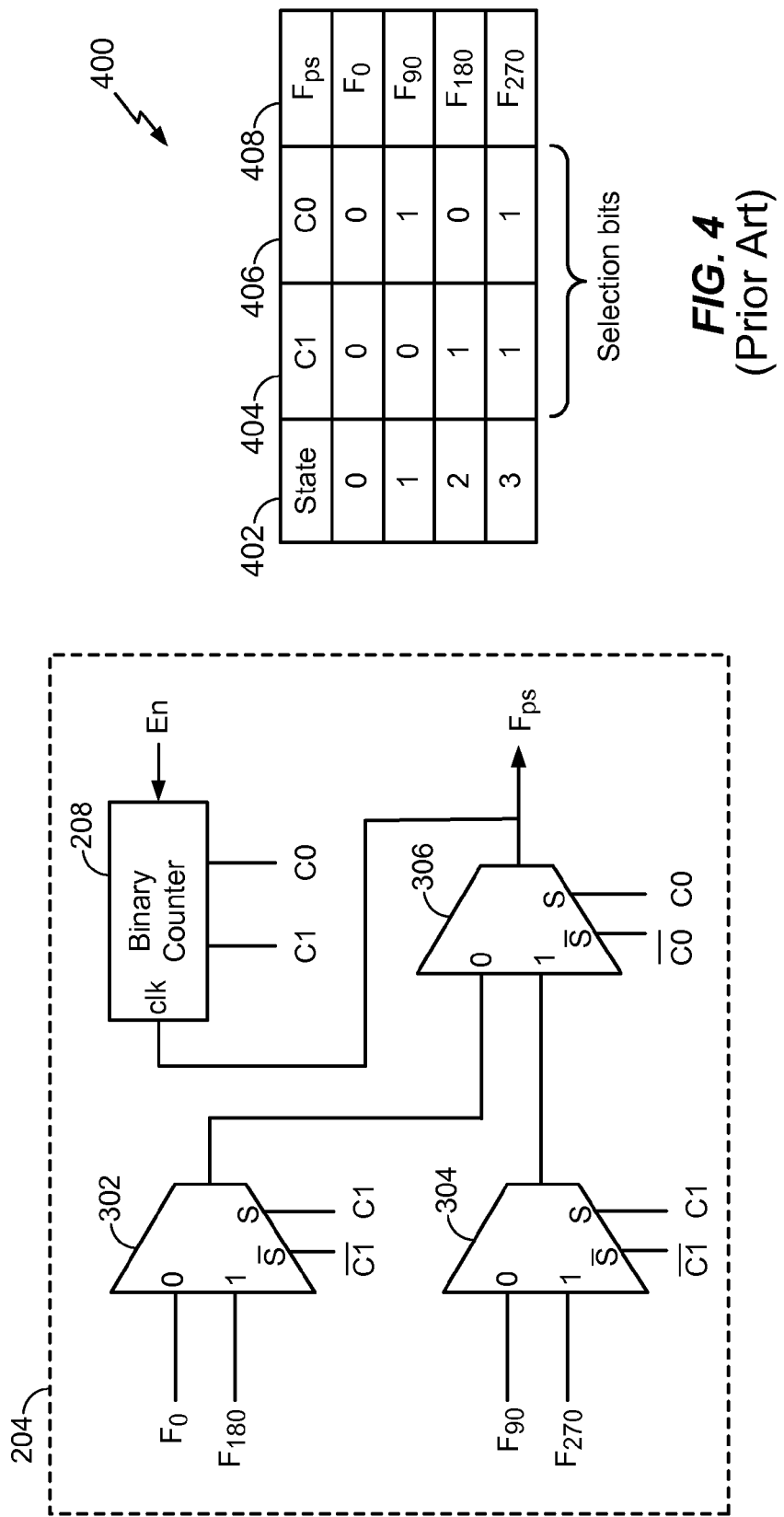

METHODS AND APPARATUS FOR A GRAY-CODED PHASE ROTATING FREQUENCY DIVIDER

BACKGROUND

1. Field

The present application relates generally to the design and operation of clock generation circuits, and more particularly, to methods and apparatus for a gray-coded phase rotating frequency divider.

2. Background

Clock generation circuits, such as phase-locked loops (PLLs), have a wide range of applications in radio, telecommunications, computers, and other electronic systems. A phase-locked loop circuit compares the phase of an input reference signal with a phase signal derived from the PLL's output oscillator and attempts to adjust the frequency of the oscillator to keep the phases matched. Typically, phase-locked loops comprise a phase detector, low pass filter and voltage-controlled oscillator (VCO) in a closed-loop configuration. A divide-by-N frequency divider may be used in the feedback path to make the PLL's output signal frequency an integer multiple of the reference. A frequency divider that switches back and forth between two integer division ratios produces a non-integer multiple of the reference frequency to form what is typically referred to as a fractional-N PLL.

Conventional frequency dividers may utilize a binary phase rotator design that has inherent linearity problems and reduced frequency of operation. For example, a binary phase rotator may introduce systematic timing errors when dividing by other than multiples of four. As a result, nonlinearity in the feedback divider may cause noise folding into the in-band of the PLL.

Therefore, it would be desirable to have a frequency divider system that overcomes the problems associated with conventional frequency dividers.

BRIEF DESCRIPTION OF THE DRAWINGS

The foregoing aspects of methods and apparatus for a gray-coded phase rotating frequency divider described herein will become more readily apparent by reference to the following description when taken in conjunction with the accompanying drawings wherein:

FIG. 3 shows a phase selector used in the prescaler of FIG. 2;

FIG. 4 shows a state table generated by the phase selector shown in FIG. 3;

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
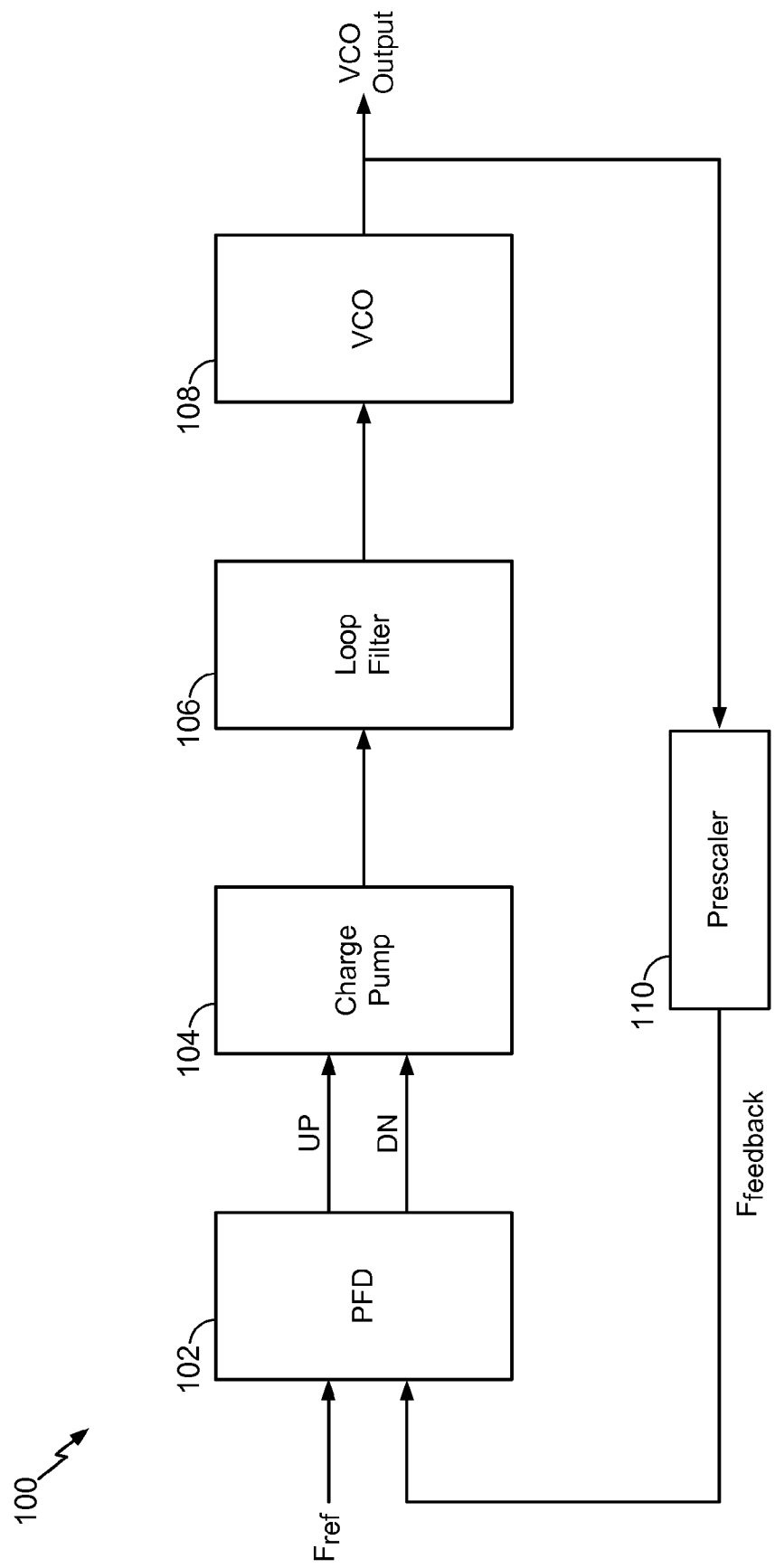
FIG. 1 shows a conventional PLL circuit.

FIG. 1 shows a conventional phase-locked loop circuit 100. For example, the PLL 100 is suitable for use in a radio transceiver. The PLL 100 comprises phase/frequency detector (PFD) 102, charge pump 104, loop filter 106, voltage controlled oscillator (VCO) 108, and prescaler 110.

During operation, the VCO 108 generates a VCO output signal that is fed into the prescaler 110. The prescaler 110 generates a feedback signal ($F_{feedback}$) that is input to the PFD 102. The PFD 102 compares the feedback signal to a reference signal ($F_{ref}$) and generates up and down adjustment signals that are input to the charge pump 104. The charge pump 104 generates an error signal that is filtered by the loop filter 106 and then input to the VCO 108 to control the frequency of the VCO output signal. Thus, the operation of the PLL 100 allows the frequency of the VCO output signal to be selected and maintained.

In this example, the prescaler 110 utilizes a binary phase rotator design that has inherent linearity problems and reduced frequency of operation. For example, a binary phase rotator may introduce systematic timing errors when dividing by various divide ratios. As a result, nonlinearity in the feedback divider may cause noise folding into the in-band of the PLL.

Figure 2:
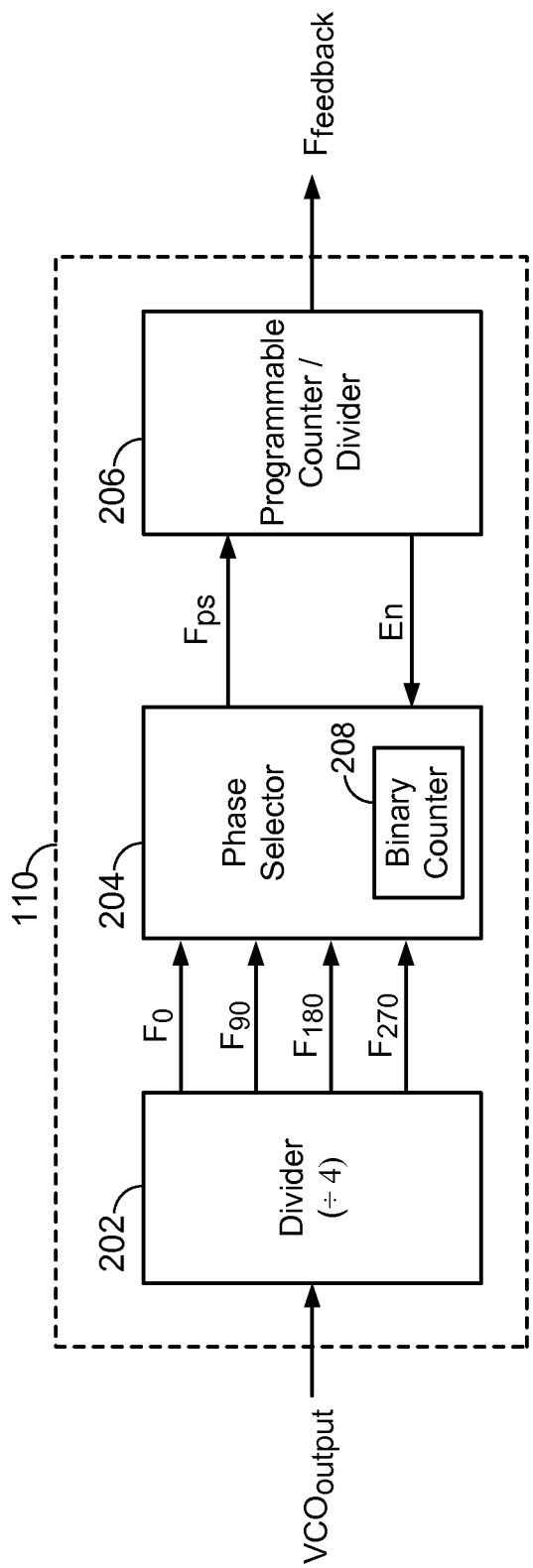
FIG. 2 shows a prescaler used in the PLL of FIG. 1.

FIG. 2 shows a detailed diagram of the prescaler 110 used in the PLL 100. The prescaler 110 comprises a divider 202, phase selector 204, and programmable counter/divider 206.

During operation, the VCO output signal is received at the divider 202, which performs a divide-by-4 operation to generate four clock phases ($F_0$, $F_{90}$, $F_{180}$, and $F_{270}$). The clock phases are input to the phase selector 204, which selects one of the phases to output as a phase selected output ($F_{ps}$). The $F_{ps}$ signal is input to the programmable counter/divider 206 which generates the feedback signal (F feedback) based on the frequency requirements that are programmed into the counter/divider 206. The counter/divider 206 also provides an enable (En) signal to the phase selector 204 that is used to enable the phase selection process.

The phase selector 204 comprises a binary counter 208 that is used in the phase selection process to select from the four input phases to produce the $F_{ps}$ signal. As discussed in further detail below, the operation of the binary counter may result in timing errors, nonlinearities or other undesirable frequency components that degrade the performance of the PLL 100.

FIG. 3 shows a detailed diagram of the phase selector 204 used in the prescaler 110. The four received clock phases ($F_0$, $F_{90}$, $F_{180}$, and $F_{270}$) are input to selectors 302 and 304. Each selector receives two phase inputs and selects one of the phase inputs to output based on the state of selection signals received at its two selector inputs (S and $S^{bar}$). For example, each selector operates to determine its output by performing the following operation.

Selector output=(Input0 AND $S^{bar}$) OR (Input1 AND S)

The outputs of the selectors 302 and 304 are input to selector 306. The binary counter 208 performs a binary counting function to generate output bits C0, C1 and the complements of C0 and C1 are also generated, for instance, using buffer invertors not shown. The output bits C0 and C1 of the binary counter 208 are used as selection bits to control the operation of the selectors 302, 304, and 306 to select one of the input phases to output as the $F_{ps}$ signal.

During operation, the binary counter 208 changes its output bits (C0 and C1) based on the selected clock phase. The binary counting operation sometimes results in more than one output bit changing state at the same time. For example, when the output bits (C0, C1) of the binary counter 208 transition from (01) to (10) both output bits change state. Changing the state of both output bits simultaneously may cause multiple selectors (i.e., 302, 304 and 306) to change their respective outputs at approximately (but not exactly) the same time thereby introducing timing errors, undesirable nonlinearities or other effects into the phase selected output signal $F_{ps}$. Such undesirable effects operate to degrade the performance of the PLL.

FIG. 4 shows an exemplary state table 400 that illustrates the transitions between states of the binary counter 208. The state table 400 illustrates a state 402, output bit C1 404, output bit C0, and a resulting phase selected to be output as the $F_{ps}$ signal. As can be seen from the state table 400, when the counter 208 transitions from state 1 to state 2, both counter output bits C1 and C0 (i.e., selection bits) change state, which may change multiple selector outputs at approximately the same time and introduce nonlinearities into the $F_{ps}$ signal that degrade the operation of the PLL.

Figure 5:
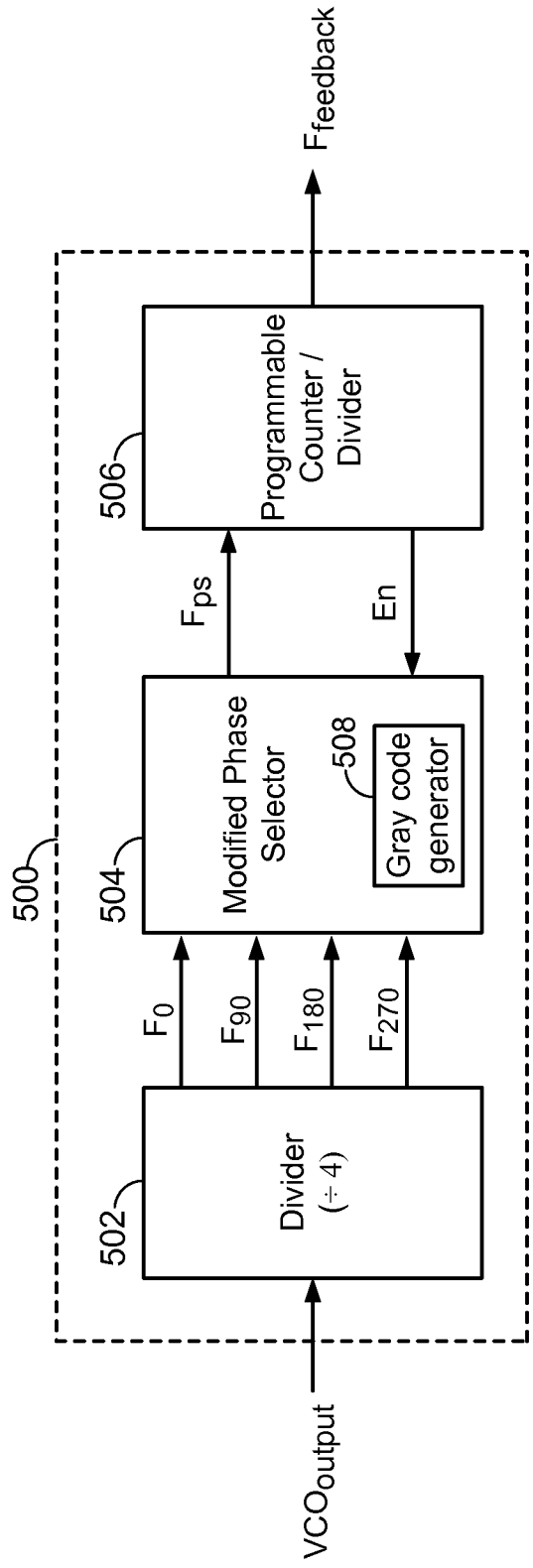
FIG. 5 shows a diagram of an exemplary prescaler comprising a modified phase selector constructed in accordance with the present invention.

FIG. 5 shows a diagram of an exemplary prescaler 500 comprising a modified phase selector constructed in accordance with the present invention. The prescaler 500 comprises a divider 502, modified phase selector 504, and programmable counter/divider 506. The modified phase selector 504 comprises a gray code generator 508. As discussed below, the modified phase selector 504 utilizes the gray code generator 508 to overcome the problems associated with conventional phase selectors.

Figure 6:
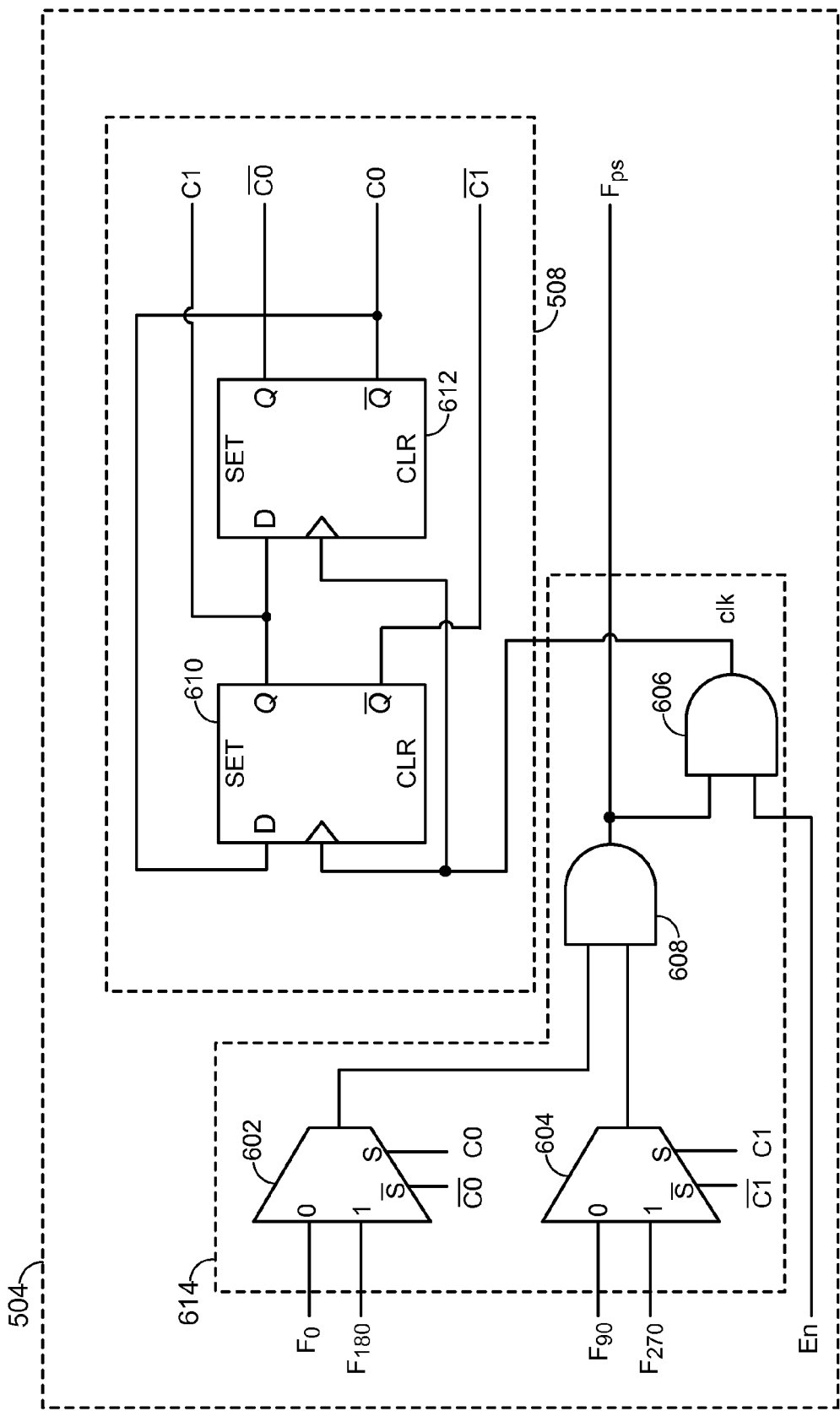
FIG. 6 shows a detailed diagram of the modified phase selector shown in FIG. 5.

FIG. 6 shows a detailed diagram of the modified phase selector 504. The four received clock phases ($F_0$, $F_{90}$, $F_{180}$, and $F_{270}$) are input to a selector circuit 614 comprising selectors 602 and 604. The outputs of the selectors 602 and 604 are input to a combining gate 608, which in this example is an AND gate that operates to combine the signals to generate the $F_{ps}$ signal.

In this implementation, the gray code generator 508 comprises D-type flip-flops 610 and 612 which are configured to generate gray coded output bits C0, C1 and associated complements $C0^{bar}$ and $C1^{bar}$. By definition, the gray coded output bits change only one bit at a time. The output bits of the gray code generator 508 are used to form selection bits that control the operation of the selectors 602 and 604 to select from of their input phases to produce their respective outputs that are combined by the AND gate 608 to produce the $F_{ps}$ output signal.

During operation, the gray code generator 508 changes its output bits (C0 and C1) based on a clock signal (clk) generated by the AND gate 606, which combines the selected clock phase $F_{ps}$ with a received enable (En) signal. The gray coded output bits C0 and C1 and corresponding selection bits result in only one selection bit (either C0 or C1) changing state at any time. With only one selection bit changing at a time, only one of the selectors 602 and 604 change its output at any time. Thus, the selectors 602 and 604 operate without introducing timing errors or other nonlinear effects typically introduced by the phase selector 204 of the conventional binary phase rotator.

The modified phase selector 504 is also suitable for use in implementations that require multiple dividers (i.e., parallel dividers) that share the same input clock. It should also be noted that that even though the resulting signal $F_{ps}$ signal does not have a 50% duty cycle due to the combining operation of the gate 608, the PLL circuit works properly because the programmable counter/divider operates 506 on rising or falling edges.

It should also be noted that the gray code generator 508 may comprise any type of gray code generator and is not limited to the implementation shown in FIG. 6. For example, the gray code generator 508 may be a gray code counter, memory, state table, or other circuit designed to output gray coded bits. In addition, the modified phase selector 504 may comprise any number of selectors that are configured to select from any number of input clock phases. As the number of selectors increase, a corresponding number of gray coded bits are generated to produce selection inputs to control the selectors. Thus, the circuit shown in FIG. 6 can be extended to generate any number of gray coded bits to utilize any number of selectors to select from a corresponding number of input clock phases to produce the $F_{ps}$ signal.

Figure 7:
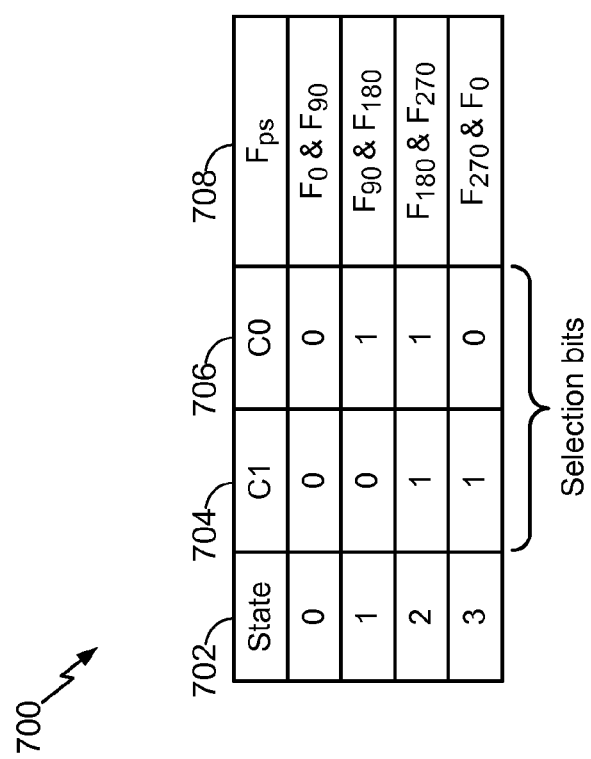
FIG. 7 shows a state table generated by the modified phase selector shown in FIG. 6.

FIG. 7 shows an exemplary state table 700 that illustrates the transitions between states of the gray code generator 508. The state table 700 illustrates a state 402, count bit C1 404, count bit C0, and a resulting phases selected to be combined and output as the $F_{ps}$ output signal. As can be seen from the state table 700, each transition between states of the gray code generator 508, results in only one of the selection bits changing state, which affects the output of only one selector. Thus, timing errors or other nonlinear effects typically introduced by the conventional binary phase rotator are avoided.

Figure 8:
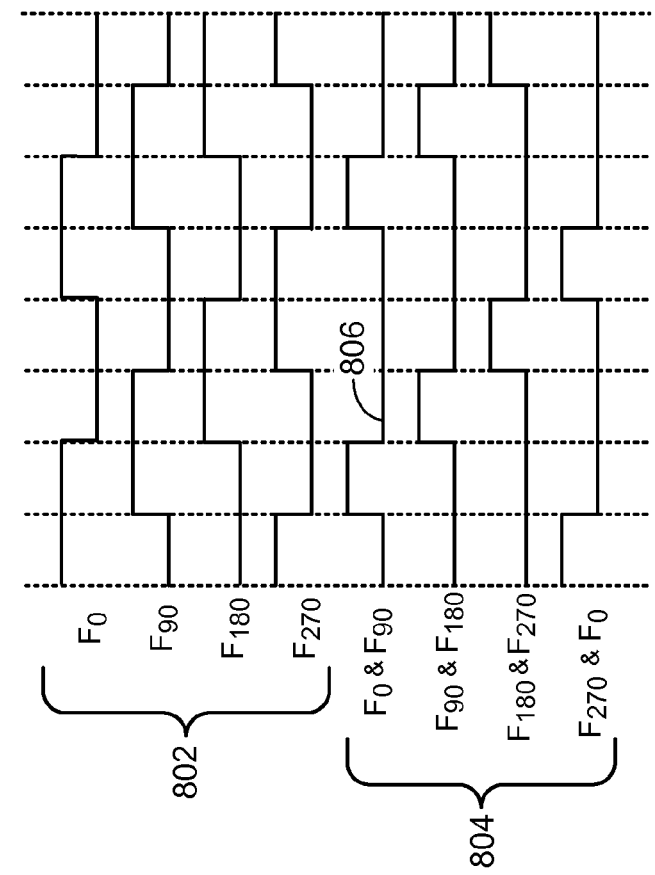
FIG. 8 shows an exemplary timing diagram illustrating the operation of the modified phase selector shown in FIG. 6.

FIG. 8 shows an exemplary timing diagram 800 illustrating the operation of the modified phase selector 504. The four phases input to the modified phase selector 504 are shown at 802. The selection and combination of two of the input phases are shown at 804. At state 0, input phases $F_0$ and $F_{90}$ are selected by the selectors 602 and 604 and combined by the AND gate 608 to generate the waveform illustrated at 806. Similarly, other states and associated combinations of the input phases are shown at 804.

Figure 9:
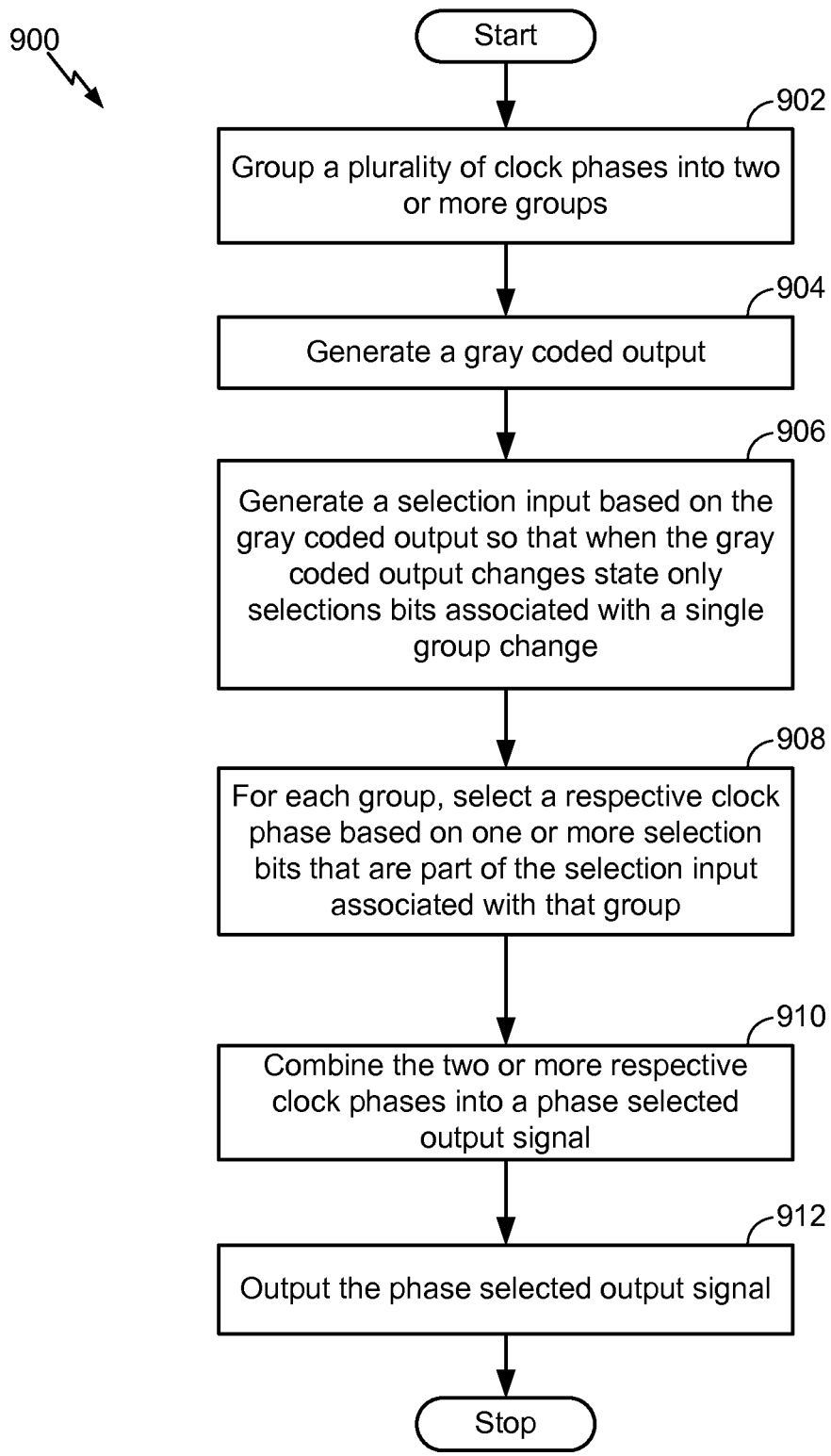
FIG. 9 shows an exemplary method for providing a gray-coded phase rotating frequency divider.

FIG. 9 shows an exemplary method 900 for providing a gray coded phase rotating frequency divider. In one Implementation, the method is performed by the modified phase selector 504 shown in FIG. 5. In other implementations, the method is encoded or embodied in hardware or as instructions or codes embodied on a computer readable medium. The instructions or codes are executable by one or more processors to perform the functions described below.

At block 902, clock phases are grouped into two or more groups. For example, a clock signal, such as a VCO output signal, undergoes a divide-by-four operation by the divider 502 to produce four clock phases that are grouped as inputs to the selectors 602 and 604.

At block 904, a gray code output is generated. For example, the gray code generator 508 is incremented by a clock to produce the gray coded output bits C0 and C1. Because it is a gray coded output, only one bit changes state after each received clock.

At block 906, a selection input is generated based on the gray coded output bits. For example, the gray coded output bit C0 is used as a selection bit to the phase selector 602 and the gray coded output bit C1 is used as a selection bit to the phase selector 604. The selection input (bits C0 and C1) are generated from the gray coded output so that when the gray coded output changes state only selection bits associated with a single group change. The state table 700 illustrates the gray coded selection bits and their corresponding transitions.

At block 908, for each group, a respective clock phase is selected based on one or more selection bits that are part of its associated selection input. For example, a respective clock phase output from the selector 602 is selected from its input clock phases based on the selection bit C0.

At block 910, the respective clock phases from each group are combined to produce a phase selected output signal. For example, the AND gate 608 is used to combine respective clock phases from the selectors 602 and 604 to form the phase selected output signal $F_{ps}$.

At block 912, the phase selected output signal is output. For example, the $F_{ps}$ signal is output to the programmable counter/divider 506, which uses this signal to generate the feedback signal $F_{feedback}$.

Therefore, the method 900 provides a gray coded phase rotating frequency divider. It should be noted that the method 900 is just one implementation and that the operations of the method 900 may be rearranged or otherwise modified such that other implementations are possible. For example, in an alternative implementation, clock phases are combined a priori as described at block 910, and then a gray coded selection input is generated as described at block 906 to enable the output of a particular clock phase combination.

Figure 10:
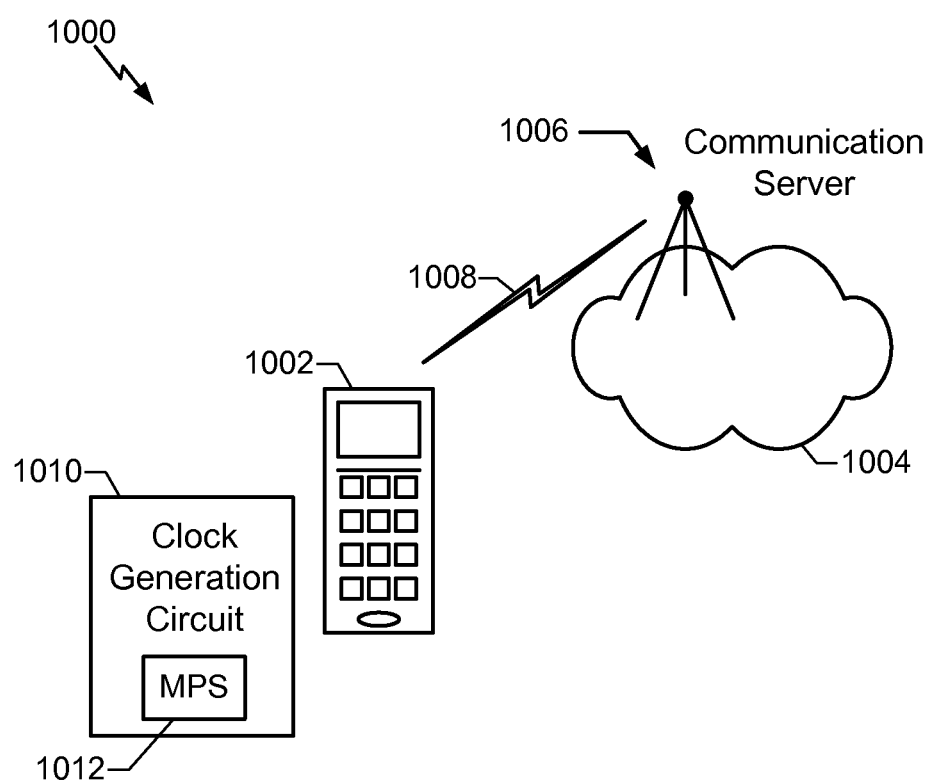
FIG. 10 shows a communication network having a device comprising a clock generation circuit having a modified phase selector constructed in accordance with the present invention.

FIG. 10 shows a communication network 1000 including a device 1002 that comprises a clock generation circuit having a modified phase selector (MPS) constructed in accordance with the present invention. The communication network 1000 comprises network 1004 which may be any type of wired and/or wireless communication network. The network 1004 comprises communication server 1006 which operates to communicate with the device 1002 using a wireless transmission link 1008. It should be noted that although only one device is shown, the communication server 1006 may wirelessly communication with any number of devices.

The device 1002 comprises a clock generation circuit 1010 having a MPS 1012 constructed in accordance with the present invention. For example, in one embodiment, the modified phase selector 1012 is the modified phase selector 504 shown in FIG. 5. In another implementation, the MPS 1012 comprises a processor executing instructions embodied on a computer-readable medium to perform the operations of the method 900.

During operation, the modified phase selector 1012 operates to select between phases generated from a VCO output signal to produce a phase selected output signal that is input to a programmable counter/divider. The phases are selected based on the output of a gray code generator and multiple selected phases are combined by a combining gate to produce the phase selected output signal.

Thus, implementations of the modified phase selector 1012 operate to overcome the problems associated with conventional phase selectors so as to improve the performance of the clock generation circuit 1010 and therefore of the device 1002. The MPS 1012 is suitable for use in any type of device utilizing a clock generation circuit, such as a wireless device, cell phone, TV or radio tuner, or any other device utilizing a PLL or clock generation circuit.

Figure 11:
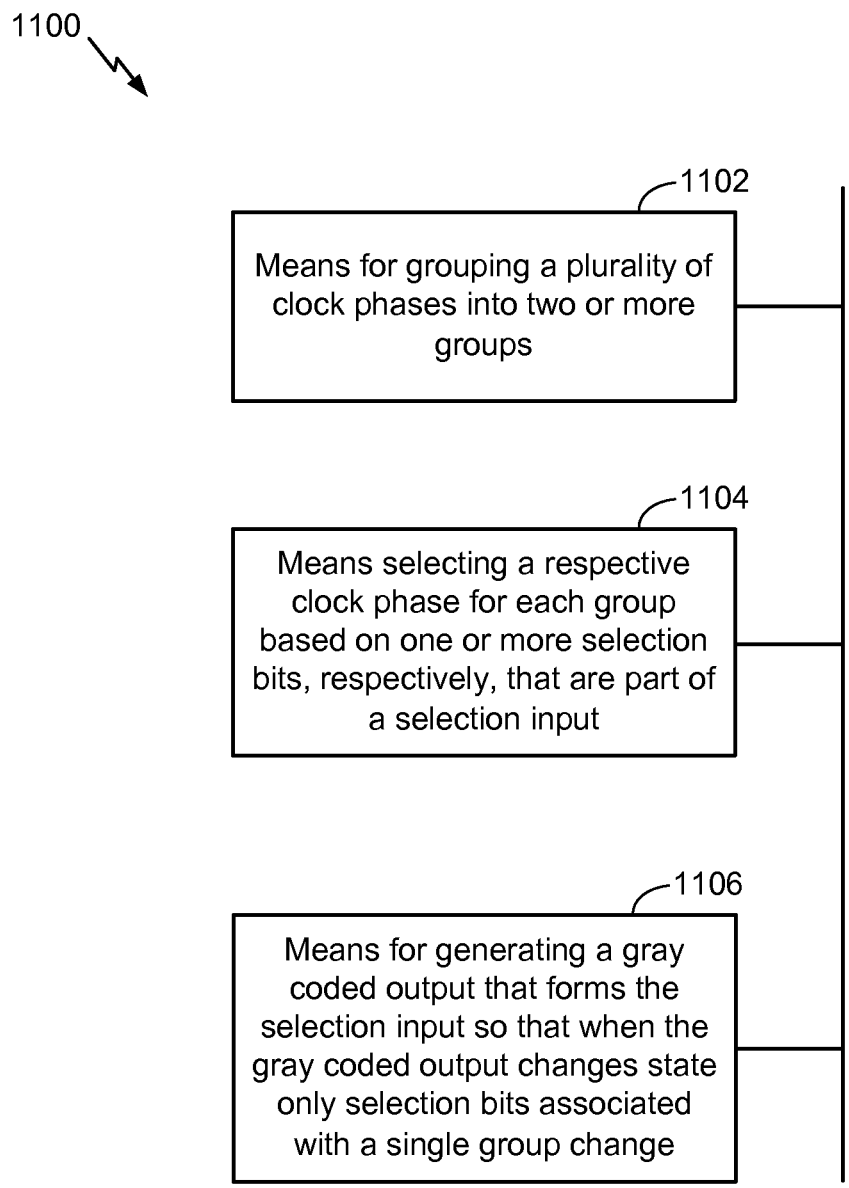
FIG. 11 shows an exemplary phase selector apparatus constructed in accordance with the present invention.

FIG. 11 shows an exemplary phase selector apparatus 1100 constructed in accordance with the present invention. For example, the apparatus 1100 is suitable for use as the modified phase selector 504 shown in FIG. 5. In one implementation, the apparatus 1100 comprises at least one integrated circuit having one or more modules where each module comprises hardware and/or hardware executing software.

The apparatus 1100 comprises a first module comprising means (1102) for grouping a plurality of clock phases into two or more groups, which in an aspect comprises the selectors 602 and 604. The apparatus 1100 also comprises a second module comprising means (1104) for selecting a respective clock phase for each group based on one or more selection bits, respectively, that are part of a selection input, which in an aspect comprises the selectors 602 and 604. The apparatus 1100 also comprises a third module comprising means (1106) for generating a gray coded output that forms the selection input so that when the gray coded output changes state only selection bits associated with a single group change, which in an aspect comprises the gray code generator 508.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or hardware executing software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, a software module (embodying codes or instructions) executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software executed by a processor, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. A phase selector, comprising:
   two or more selectors, each selector configured to receive multiple clock phases and output a respective clock phase based on one or more selection bits that are part of a selection input signal, and wherein the selection input signal is simultaneously input to the selectors; and
   a gray code generator configured to generate a gray coded output that forms the selection input signal so that when the gray coded output changes state only selection bits associated with a single selector change.

2. The phase selector of claim 1, further comprising a combining module that combines two or more respective clock phases to generate a selected clock phase.

3. The phase selector of claim 2, wherein the plurality of clock phases comprise four clock phases identified as $F_0$, $F_{90}$, $F_{180}$, and $F_{270}$, and the two or more selectors comprises:
   a first selector that selects a first clock phase from the $F_0$ and $F_{180}$ clock phases based on first selection bits; and
   a second selector that selects a second clock phase from the $F_{90}$ and $F_{270}$ clock phases based on second selection bits.

4. The phase selector of claim 3, wherein the combining module comprises an AND gate that receives the first and second clock phases and combines them to form the selected clock phase, wherein the selected clock phase is one of ($F_0$ AND $F_{90}$), ($F_{90}$ AND $F_{180}$), ($F_{180}$ AND $F_{270}$), or ($F_{270}$ AND $F_0$).

5. The phase selector of claim 1, wherein the gray code generator is one of a gray code counter or a gray coded state table that generates the gray coded output.

6. The phase selector of claim 1, wherein the phase selector forms part of a clock generation circuit in a device.

7. A method for phase selection, the method comprising:
   grouping a plurality of clock phases into two or more groups;
   for each group, selecting a respective clock phase based on one or more selection bits that are part of a selection input signal, and wherein the operation of selecting uses the selection input signal to simultaneously select from the groups; and
   generating a gray coded output that forms the selection input signal so that when the gray coded output changes state only selection bits associated with a single group change.

8. The method of claim 7, further comprising combining two or more respective clock phases to generate a selected clock phase.

9. The method of claim 8, wherein the plurality of clock phases comprise four clock phases identified as $F_0$, $F_{90}$, $F_{180}$, and $F_{270}$, and the method comprises:
   selecting a first clock phase from a first group comprising the $F_0$ and $F_{180}$ clock phases based on first selection bits; and
   selecting a second clock phase from a second group comprising the $F_{90}$ and $F_{270}$ clock phases based on second selection bits.

10. The method of claim 9, wherein said combining comprises ANDing the first and second clock phases to form the selected clock phase, wherein the selected clock phase is one of ($F_0$ AND $F_{90}$), ($F_{90}$ AND $F_{180}$), ($F_{180}$ AND $F_{270}$), or ($F_{270}$ AND $F_0$).

11. The method of claim 7, wherein said generating comprises generating the gray coded output using one of a gray code counter or a gray coded state table.

12. The method of claim 7, wherein the method is utilized as part of a clock generation circuit in a device.

13. A computer program product for phase selection, comprising:
   a computer-readable medium embodying codes executable by a processor to cause the processor to:
   group a plurality of clock phases into two or more groups;
   for each group, select a respective clock phase based on one or more selection bits that are part of a selection input signal, and wherein the selection input signal is used to simultaneously select from the groups; and
   generate a gray coded output that forms the selection input signal so that when the gray coded output changes state only selection bits associated with a single group change.

14. The computer-readable medium of claim 13, wherein said codes are configured to cause the processor to combine two or more respective clock phases to generate a selected clock phase.

15. The computer-readable medium of claim 13, wherein said codes are configured to cause the processor to generate the gray coded output using one of a gray code counter or a gray coded state table.

16. A phase selector apparatus, comprising:
- means for grouping a plurality of clock phases into two or more groups;
- means for selecting a respective clock phase for each group based on one or more selection bits, respectively, that are part of a selection input signal, and wherein the means for selecting uses the selection input signal to simultaneously select from the groups; and
- means for generating a gray coded output that forms the selection input signal so that when the gray coded output changes state only selection bits associated with a single group change.

17. The phase selector apparatus of claim 16, further comprising means for combining two or more respective clock phases to generate a selected clock phase.

18. The phase selector apparatus of claim 17, wherein the plurality of clock phases comprise four clock phases identified as $F_0$, $F_{90}$, $F_{180}$, and $F_{270}$, and the apparatus comprises:
- means for selecting a first clock phase from a first group comprising the $F_0$ and $F_{180}$ clock phases based on first selection bits; and
- means for selecting a second clock phase from a second group comprising the $F_{90}$ and $F_{270}$ clock phases based on second selection bits.

19. The phase selector apparatus of claim 18, wherein said means for combining comprises means for combining the first and second clock phases to form the selected clock phase, wherein the selected clock phase is one of ($F_0$ AND $F_{90}$), ($F_{90}$ AND $F_{180}$), ($F_{180}$ AND $F_{270}$), or ($F_{270}$ AND $F_0$).

20. The phase selector apparatus of claim 16, wherein the apparatus is utilized as part of a clock generation circuit in a device.

* * * * *